United States Patent
Izumi et al.

(10) Patent No.: US 10,803,404 B2
(45) Date of Patent: Oct. 13, 2020

(54) CIRCUIT CONFIGURATION OPTIMIZATION APPARATUS AND MACHINE LEARNING DEVICE FOR LEARNING A CONFIGURATION OF A FIELD PROGRAMMABLE GATE ARRAY (FPGA) DEVICE

(71) Applicant: FANUC Corporation, Yamanashi (JP)

(72) Inventors: Hitoshi Izumi, Yamanashi (JP); Kenichiro Kurihara, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 255 days.

(21) Appl. No.: 15/950,258

(22) Filed: Apr. 11, 2018

(65) Prior Publication Data

US 2018/0300652 A1 Oct. 18, 2018

(30) Foreign Application Priority Data

Apr. 13, 2017 (JP) ................................ 2017-080016

(51) Int. Cl.
*G06N 20/00* (2019.01)
*H03K 19/17764* (2020.01)
(Continued)

(52) U.S. Cl.
CPC ............. *G06N 20/00* (2019.01); *G06N 3/063* (2013.01); *G06N 3/08* (2013.01); *H03K 19/17764* (2013.01); *G06N 3/0481* (2013.01)

(58) Field of Classification Search
None
See application file for complete search history.

(56) References Cited

U.S. PATENT DOCUMENTS 4,187,834 A * 2/1980 Hoinski .............. F24D 19/1075
126/574
4,326,685 A * 4/1982 Reed ..................... G05D 1/0202
244/168

(Continued)

FOREIGN PATENT DOCUMENTS

CN 103365731 B * 7/2016
JP 2006-344223 A 12/2006
(Continued)

OTHER PUBLICATIONS

Nicolaidis, M. (Ed.). (2010). Soft errors in modern electronic systems (vol. 41). Springer Science & Business Media. 331 pages. DOI 10.1007/978-1-4419-6993-4 (Year: 2011).*

(Continued)

*Primary Examiner* — Kamran Afshar
*Assistant Examiner* — Benjamin J Buss
(74) *Attorney, Agent, or Firm* — Hauptman Ham, LLP

(57) ABSTRACT

Provided are a circuit configuration optimization apparatus and a machine learning device capable of reducing the occurrence frequency of a malfunction based on one of the current position and the current time of a FPGA device. The circuit configuration optimization apparatus includes: a state data acquisition section that acquires at least one of a current position and current time of the FPGA device as state data; and a circuit configuration determination section that determines a circuit configuration of the FPGA device based on the state data acquired by the state data acquisition section, and outputs a command value for reconfiguring the determined circuit configuration on the FPGA device.

10 Claims, 10 Drawing Sheets

(51) Int. Cl.
*G06N 3/08* (2006.01)
*G06N 3/063* (2006.01)
*G06N 3/04* (2006.01)

(56) References Cited

U.S. PATENT DOCUMENTS

| | | | | |
|---|---|---|---|---|
| 5,317,145 | A * | 5/1994 | Corio | G01S 3/7861 |
| | | | | 250/203.4 |
| 7,320,114 | B1 * | 1/2008 | Jain | G06F 11/261 |
| | | | | 714/47.1 |
| 7,620,876 | B2 | 11/2009 | Lewis et al. | |
| 9,792,397 | B1 * | 10/2017 | Nagaraja | G06F 30/3323 |
| 10,176,527 | B1 * | 1/2019 | Freeman | G06Q 40/08 |
| 10,425,081 | B2 * | 9/2019 | Sakata | G01R 31/31703 |
| 2004/0030956 | A1 * | 2/2004 | Rodbell | H04L 1/0001 |
| | | | | 714/26 |
| 2005/0116361 | A1 * | 6/2005 | Fukui | G11C 11/412 |
| | | | | 257/1 |
| 2006/0247973 | A1 * | 11/2006 | Mueller | G06N 3/126 |
| | | | | 705/14.14 |
| 2007/0011578 | A1 | 1/2007 | Lewis et al. | |
| 2007/0226572 | A1 * | 9/2007 | Zhang | G06F 11/261 |
| | | | | 714/742 |
| 2007/0236187 | A1 * | 10/2007 | Wai | H02J 3/382 |
| | | | | 323/222 |
| 2011/0099440 | A1 * | 4/2011 | Mims | G01R 31/31816 |
| | | | | 714/726 |
| 2013/0096902 | A1 * | 4/2013 | Bose | G01R 31/318357 |
| | | | | 703/14 |
| 2014/0164839 | A1 * | 6/2014 | Toba | H03K 19/17756 |
| | | | | 714/37 |
| 2014/0331207 | A1 * | 11/2014 | Sridharan | G06F 9/4843 |
| | | | | 717/124 |
| 2016/0085605 | A1 * | 3/2016 | Shimbo | G06F 11/0736 |
| | | | | 714/704 |
| 2016/0241036 | A1 * | 8/2016 | Wolter | H02J 3/381 |
| 2016/0266964 | A1 | 9/2016 | Uekusa | |
| 2016/0323143 | A1 * | 11/2016 | Kim | G06F 3/0629 |
| 2017/0031328 | A1 * | 2/2017 | Sawada | G05B 13/028 |
| 2017/0031331 | A1 * | 2/2017 | Morita | G05B 11/01 |
| 2017/0033726 | A1 * | 2/2017 | Yamamoto | H02H 3/00 |
| 2017/0091667 | A1 * | 3/2017 | Yukawa | G06N 20/00 |
| 2018/0121587 | A1 * | 5/2018 | Monga | H01L 27/0886 |
| 2018/0174040 | A1 * | 6/2018 | Davies | G06N 3/049 |
| 2018/0224825 | A1 | 8/2018 | Tamai | |
| 2018/0260498 | A1 * | 9/2018 | Nagaraja | G06F 30/3323 |
| 2018/0278254 | A1 * | 9/2018 | Sakata | H03K 19/17732 |
| 2018/0300442 | A1 * | 10/2018 | Izumi | G06F 30/398 |
| 2018/0300652 | A1 * | 10/2018 | Izumi | H03K 19/17764 |
| 2019/0305927 | A1 * | 10/2019 | Bhunia | H03K 19/00 |

FOREIGN PATENT DOCUMENTS

| | | |
|---|---|---|
| JP | 2010-226524 A | 10/2010 |
| JP | 2013-532409 A | 8/2013 |
| JP | 2016-167669 A | 9/2016 |
| JP | 2018-128821 A | 8/2018 |
| WO | 2011/143035 A1 | 11/2011 |

OTHER PUBLICATIONS

Benzekri, A. et al. (2014). "FPGA-based design process of a fuzzy logic controller for a dual-axis sun tracking system." Arabian Journal for Science and Engineering 39.8 (2014): 6109-6123. DOI 10.1007/s13369-014-1213-5 (Year: 2014).*

Office Action in JP Application No. 2017-080016, dated Jan. 8, 2019, 6pp.

* cited by examiner

CIRCUIT CONFIGURATION OPTIMIZATION APPARATUS AND MACHINE LEARNING DEVICE FOR LEARNING A CONFIGURATION OF A FIELD PROGRAMMABLE GATE ARRAY (FPGA) DEVICE

RELATED APPLICATIONS

The present application claims priority to Japanese Application Number 2017-080016, filed on Apr. 13, 2017, the disclosure of which is hereby incorporated by reference herein in its entirety.

BACKGROUND OF THE INVENTION

1. Field of the Invention

The present invention relates to a circuit configuration optimization apparatus and a machine learning device.

2. Description of the Related Art

Whereas there are standard integrated circuits in which all the circuits are fixed at the time of manufacture, there are programmable logic devices (PLDs) that can function when, even after shipment, users set desired circuit configurations. Examples of such devices include field programmable gate arrays (FPGAs), which may be used by configuring, as necessary, circuits including simple logic circuits and complicated circuits having a memory element at sites where the FPGAs are used, by combining logic blocks, which are programmable logic components. In the FPGAs, such circuits may be structured at any position on packages.

When entering a FPGA device, a neutron beam contained in cosmic rays or the like collides with boron or the like in a package to cause the occurrence of a large amount of ions containing α-rays and a potential inside silicon is reversed due to the α-rays. As a result, a soft error occurs. Note that as a related art concerning a soft error in a FPGA device, Japanese Patent Application Laid-open No. 2006-344223 and Japanese Patent Application Laid-open No. 2016-167669 disclose a technology for detecting the occurrence of a soft error.

The occurrence frequency of a soft error in a FPGA device changes depending on the density of boron (the degree of boron concentration) or the like contained in a packaging material constituting the FPGA device. FIG. 10 shows the schematic structural diagrams of FPGA devices. When the FPGA devices have a region in which boron concentration is high as shown in FIG. 10, it is highly likely that a soft error occurs in the region. Therefore, countermeasures against the soft error are taken in such a way that circuits are not arranged in the region or noise-robust circuits having an error correcting function or redundancy are arranged.

Examples of countermeasures against a soft error include a method in which circuits are not arranged at a position at which the concentration of boron or the like is high, a method in which the area of circuits is reduced by the elimination or the like of some unnecessary functions to reduce a probability that neutrons or α-rays collide with the circuits, and a method in which an error correcting function is added by the multiplexing of logic circuits, an error correcting circuit, or the like. However, such countermeasures against a soft error have both strong and weak points, and the application of the countermeasures is not always optimum. For example, the method in which the area of circuits is reduced is performed at the expense of some functions, and the method in which logic circuits are multiplexed uses a greater area of circuits and consumes a greater amount of power compared with a standard circuit configuration. In addition, when an error correcting circuit such as an ECC is added, power consumption and heat generation also increase, besides an increase in the area of circuits.

On the other hand, a soft error in a FPGA device occurs when neutron rays contained in cosmetic rays or the like enter the FPGA device as described above. Therefore, a probability that neutron rays enter a FPGA device changes depending on the positional relationship between a position at which the FPGA device exists and the position of the sun or the earth. Thus, it is necessary to substantially take the above countermeasures against a soft error when a FPGA device is set at a position at which much cosmic rays fall on the FPGA device (for example, a case in which the FPGA is set at a position facing the sun on the earth or a case in which the FPGA is set on an artificial satellite at a position facing the sun). On the other hand, it is not necessary to consider the above countermeasures against a soft error when the FPGA device is set at a position at which much cosmic rays do not fall on the FPGA device (for example, a case in which the FPGA device is set at a position not facing the sun on the earth or a case in which the FPGA is set on an artificial satellite at a position not facing the sun). Thus, the significance of the countermeasures against a soft error changes depending on a position at which the FPGA device exists.

SUMMARY OF THE INVENTION

In view of the above problem, the present invention has an object of providing a circuit configuration optimization apparatus and a machine learning device capable of reducing the occurrence frequency of a malfunction based on one of the current position and the current time of a FPGA device.

A circuit configuration optimization apparatus according to the present invention collects data on the state of a FPGA device including one of the current position and the current time of the FPGA device and determines the arrangement of respective circuits of the FPGA device and the variations of the circuits based on the state data. Then, the circuit configuration optimization apparatus reconfigures the FPGA device based on the determined arrangement of the respective circuits and the variations of the circuits to make the FPGA device have a circuit configuration by which a secured operation is obtained at a current position or current time. Moreover, the circuit configuration optimization apparatus according to the present invention stores the number of soft-error occurrence times in the FPGA device in association with a position on the FPGA device and performs machine learning using the stored number of the soft-error occurrence times and one of the current position and the current time of the FPGA device as state data. As a result, the circuit configuration optimization apparatus is allowed to derive an optimum circuit configuration by which the secured operation of the FPGA device is obtained.

According to an embodiment of the present invention, a circuit configuration optimization apparatus optimizes a circuit configuration and arrangement of a FPGA device. The circuit configuration optimization apparatus includes: a state data acquisition section that acquires at least one of a current position and current time of the FPGA device as state data; and a circuit configuration determination section that determines a circuit configuration of the FPGA device based on the state data acquired by the state data acquisition section, and outputs a command value for reconfiguring the determined circuit configuration on the FPGA device.

According to another embodiment of the present invention, the circuit configuration optimization apparatus includes the state data acquisition section that acquires, as the state data, information relating to the circuit configuration of the FPGA device, information indicating an error occurrence state of the FPGA device, and at least one of a current position and current time of the FPGA device, and a machine learning device that learns the circuit configuration of the FPGA device. The machine learning device has: a state observation section that observes, as state variables expressing a current state of an environment, FPGA device circuit configuration data indicating the circuit configuration of the FPGA device, FPGA error occurrence state data indicating the error occurrence state of the FPGA device, and current position/time data indicating at least one of a current position and current time, from the state data acquisition section; a determination data acquisition section that acquires determination data indicating a propriety determination result of an operating state of the FPGA device; and a learning section that learns the circuit configuration of the FPGA device in association with the FPGA error occurrence state data and the current position/time data, using the state variables and the determination data.

According to another embodiment of the present invention, a machine learning device performs machine learning of a circuit configuration of a FPGA device. The machine learning device includes: a state observation section that observes, as state variables expressing a current state of an environment, FPGA device circuit configuration data indicating the circuit configuration of the FPGA device, FPGA error occurrence state data indicating an error occurrence state of the FPGA device, and current position/time data indicating at least one of a current position and current time; a determination data acquisition section that acquires determination data indicating a propriety determination result of an operating state of the FPGA device; and a learning section that learns the circuit configuration of the FPGA device in association with the FPGA error occurrence state data and the current position/time data, using the state variables and the determination data.

According to an embodiment of the present invention, the circuit configuration of a FPGA device is determined based on one of the current position and the current time of the FPGA device, whereby it is possible to reduce the frequency of the malfunction of the FPGA device and improve the operating ratio of an apparatus in which the FPGA device is installed. In addition, the relationship between the error occurrence state of the FPGA device and one of the current position and the current time of the FPGA device is learned, whereby it is possible to more flexibly reduce the frequency of the malfunction of the FPGA device.

BRIEF DESCRIPTION OF THE DRAWINGS

The above and other objects and features of the present invention will become apparent from the descriptions of the following embodiments with reference to the accompanying drawings in which.

DETAILED DESCRIPTION OF THE PREFERRED EMBODIMENTS

Hereinafter, a description will be given of an embodiment of the present invention with reference to the drawings.

Figure 1:
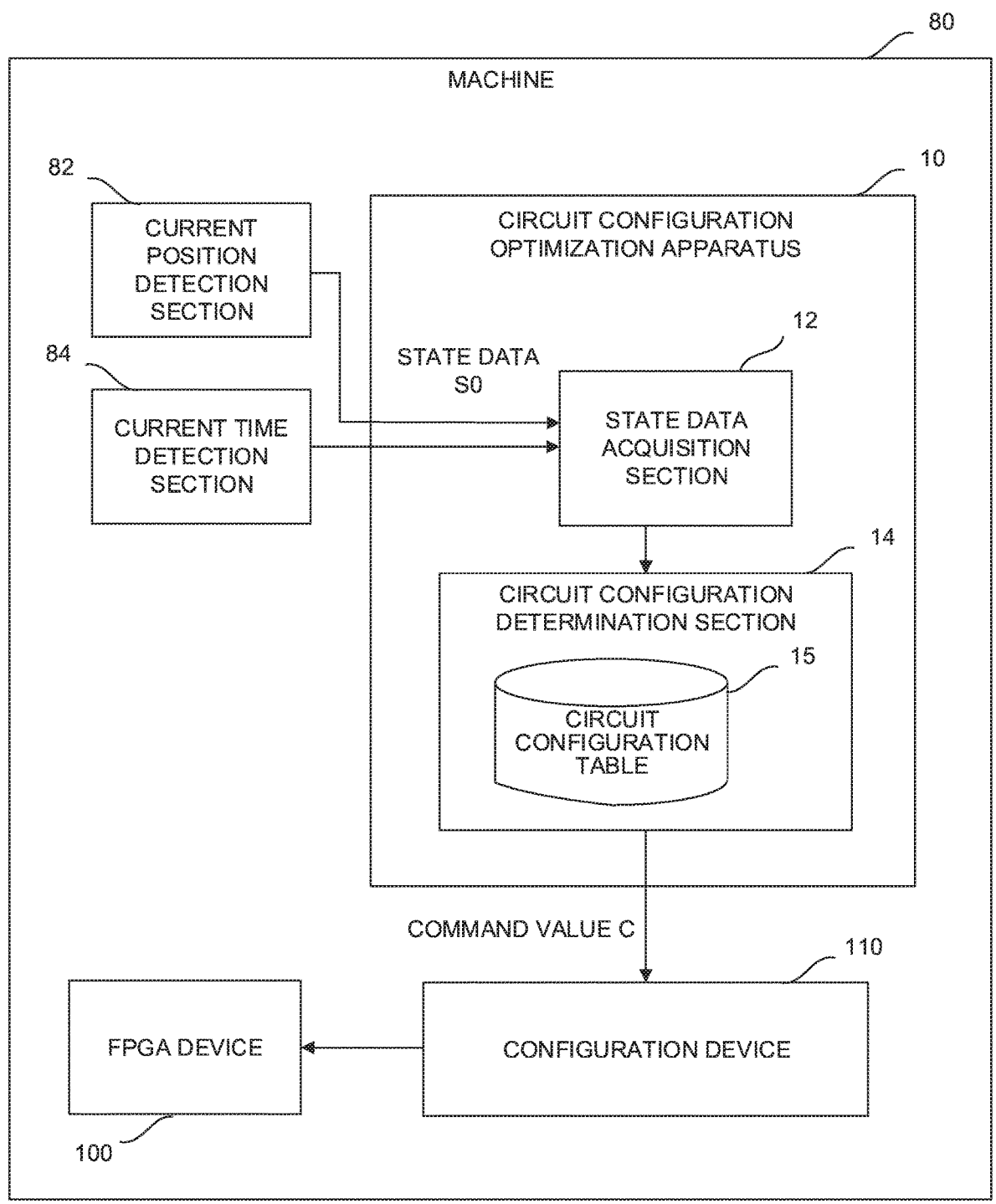
FIG. 1 is a schematic function block diagram of a circuit configuration optimization apparatus according to a first embodiment.

FIG. 1 is a schematic function block diagram of a circuit configuration optimization apparatus 10 according to a first embodiment. As shown in the function block of FIG. 1, a machine 80 in which the circuit configuration optimization apparatus 10 is incorporated includes a FPGA device 100 serving as a constituent of the machine 80 and a configuration device 110 that reconfigures the FPGA device 100. In addition, the machine 80 includes a current position detection section 82 that detects the current position of an industrial machine and a current time detection section 84 that detects current time.

The FPGA device 100 is responsible for a part of a configuration necessary for controlling the machine 80 or a part of a configuration necessary for the machine 80 to provide a function. When the machine 80 is, for example, a robot, the FPGA device 100 may be a part of circuits for controlling the joints of the robot. When the machine 80 is, for example, observation equipment, the FPGA device 100 may be a part of circuits for processing observed data. Since the detailed configuration of the FPGA device 100 has been known, its description will be omitted in the specification.

The configuration device 110 is configured as a device including a configuration necessary for reconfiguring circuits configured on the FPGA device 100. The configuration device 110 may include a storage unit (not shown) that stores configuration data on logic circuits configured on the FPGA device 100. In addition, the configuration data stored in the storage unit by the configuration device 110 may contain the variations of the logic circuits configured on the FPGA device 100 (such as a logic circuit with a reduced circuit area, a multiplexing logic circuit, and a logic circuit with an error correcting circuit).

Upon receiving at least the positions of the respective logic circuits of the FPGA device 100 and a command value C for commanding the variations of the logic circuits, the configuration device 110 selects configuration data corresponding to the command value C and reconfigures the FPGA device based on the selected configuration data. Since detailed processing on the reconfiguration by the configuration device 110 has been known, its description will be omitted in the specification.

The current position detection section 82 is function means for detecting and outputting the current position of the machine 80. The current position detection section 82 may be, for example, a device that measures a position based on radio waves output from a global positioning system (GPS), a base station for mobile phones, or the like, a device that measures a current position from the position of an observed star, a structure on the ground, or the like, a device that acquires a current position from an external signal, or the like.

The current time detection section 84 is function means for detecting and outputting current time. The current time detection section 84 may be, for example, one that detects current time from timing means such as a real time clock (RTC) included in the machine 80, a device that acquires current time from an external signal, or the like.

The circuit configuration optimization apparatus 10 may be mounted as, for example, an apparatus such as a personal computer (PC) including a central processing unit (CPU), a memory, or the like installed on the machine 80. The circuit configuration optimization apparatus 10 includes software and hardware (the CPU of a computer) for outputting a command value C for commanding the arrangement of circuits of the FPGA device 100 to the configuration device 110 that reconfigures the FPGA device 100 installed in the machine 80.

The circuit configuration optimization apparatus 10 includes a state data acquisition section 12 that acquires state data indicating the state of the machine 80, and a circuit configuration determination section 14 that determines the circuit configuration of the FPGA device 100 based on the state data acquired by the state data acquisition section 12 and outputs a command value C based on the determined circuit configuration.

The state data acquisition section 12 may be configured as, for example, one of the functions of a CPU that controls the input/output of a computer. Alternatively, the state data acquisition section 12 may be configured as, for example, software for functioning the CPU that controls the input/output of the computer. The state data acquisition section 12 acquires at least one of the current position of the machine 80 detected by the current position detection section 82 and current time detected by the current time detection section 84 as state data S0 and gives the acquired state data S0 to the circuit configuration determination section 14.

The circuit configuration determination section 14 determines the positions of respective circuits of the FPGA device 100 and the variations of the circuits based on state data S0 acquired from the state data acquisition section 12, generates a command value C based on the determined positions of the respective circuits and the variations of the circuits, and outputs the generated command value C to the configuration device 110. The circuit configuration determination section 14 may store a circuit configuration table 15, in which a plurality of sets of the positions of the respective circuits and the variations of the circuits with respect to the combinations of the respective values (or the ranges of the respective values) of the state data S0 is stored, in a memory or the like (not shown) in advance and refer to the circuit configuration table 15 to determine the positions of the respective circuits and the variations of the circuits corresponding to the input state data S0. The command value C output from the circuit configuration determination section 14 may take any data form so long as the configuration device 110 is allowed to specify the positions of the respective circuits of the FPGA device 100 and the variations of the circuits (such as a standard circuit, a circuit with a reduced area, a multiplexing circuit, and a circuit with an error correcting function). In this case, the circuit configuration table 15 may be so configured as to have a circuit configuration that places higher priority on functions, processing speeds, power consumption, heating values, or the like added to the respective circuits than on anti-soft error measures in, for example, a case in which the current position of the machine 80 is a position at which the machine 80 does not face the sun or a case in which current time is time at which the machine 80 does not face the sun, and may be so configured as to have a circuit configuration that places higher priority on the anti-soft error measures than on the functions, the processing speeds, the power consumption, the heating values, or the like added to the respective circuits in, for example, a case in which the current position of the machine 80 is a position at which the machine 80 faces the sun or a case in which the current time is time at which the machine 80 faces the sun.

According to the above configuration example, since the circuit configuration optimization apparatus 10 determines, based on one of the current position or the current time of the machine 80 in which the FPGA device 100 is installed, the circuit configuration of the FPGA device 100 suitable for the current position or the current time, it is possible to reduce the frequency of the malfunction of the FPGA device and improve the operating ratio of an apparatus in which the FPGA device is installed.

Figure 2:
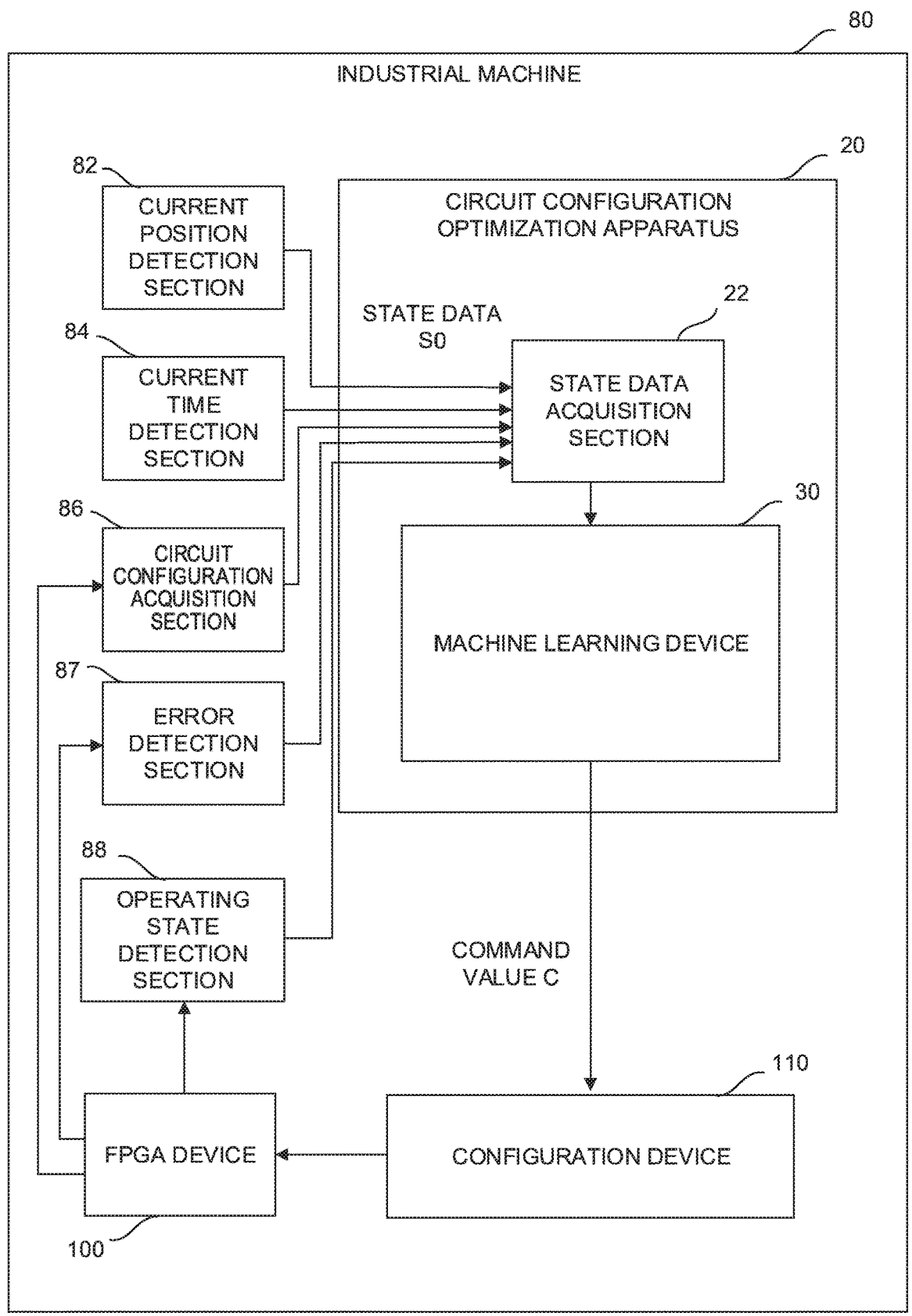
FIG. 2 is a schematic function block diagram of a circuit configuration optimization apparatus according to a second embodiment.

FIG. 2 is a schematic function block diagram of a circuit configuration optimization apparatus 20 according to a second embodiment. In the circuit configuration optimization apparatus 20 according to the embodiment, a machine learning device 30 is mounted as the circuit configuration determination section 14 described in the first embodiment. As shown in the function block of FIG. 2, a machine 80 in which the circuit configuration optimization apparatus 20 is incorporated includes, like the first embodiment, a FPGA device 100 serving as a constituent of the machine 80, a configuration device 110 that reconfigures the FPGA device 100, a current position detection section 82 that detects the current position of the industrial machine, and a current time detection section 84 that detects current time. In addition, the machine 80 includes a circuit configuration acquisition section 86 that acquires the circuit configuration of the FPGA device 100, an error detection section 87 that detects the state of a soft error occurring in the FPGA device 100, and an operating state detection section 88 that detects the operating state of the FPGA device 100.

The circuit configuration acquisition section 86 is function means for acquiring the configuration of circuits configured on the FPGA device 100. The circuit configuration acquisition section 86 may acquire the circuit configuration of the FPGA device 100 from the FPGA device 100 or may acquire information on the circuits finally configured on the FPGA device 100 by the configuration device 110 from the configuration device 110. The circuit configuration acquisition section 86 outputs the acquired information relating to the circuit configuration to the circuit configuration optimization apparatus 20.

The error detection section 87 is function means for detecting the occurrence of an error in the FPGA device 100. The error detection section 87 may be, for example, one capable of detecting a position at which a soft error has occurred in the FPGA device 100 or one capable of detecting a circuit on the FPGA device 100 in which a soft error has occurred. The error detection section 87 outputs information relating to the occurrence of a detected error in the FPGA device 100 to the circuit configuration optimization apparatus 20. Since detailed processing for detecting an error in the FPGA device 100 by the error detection section 87 has been known, its description will be omitted in the specification.

The operating state detection section 88 is function means for detecting an operating state such as an operating speed, a heating value, and power consumption of the FPGA device 100. For example, the operating state detection section 88 detects time necessary for performing processing on respective circuits with a timer circuit or the like of the machine 80, detects the temperature of the FPGA device 100 with a temperature sensor or the like of the machine 80, and detects power consumption of the FPGA device 100 per prescribed unit time with a power meter or the like of the machine 80. Then, the operating state detection section 88 outputs the detected respective values to the circuit configuration optimization apparatus 20 as information relating to the operating state of the FPGA device 100.

Like the first embodiment, the circuit configuration optimization apparatus 20 may be mounted as, for example, an apparatus such as a PC including a CPU and a memory provided on the machine 80. The circuit configuration optimization apparatus 10 includes software and hardware (the CPU of a computer) for outputting a command value C for commanding the arrangement of the circuits of the FPGA device 100 to the configuration device 110 that reconfigures the FPGA device 100 installed in the machine 80. The circuit configuration optimization apparatus 10 includes a state data acquisition section 22 that acquires state data indicating information relating to the state of the machine 80, and a machine learning device 30 that performs the machine learning of the circuit configuration of the FPGA device 100 based on the state data acquired by the state data acquisition section 22 and determines the circuit configuration of the FPGA device 100 with respect to the state data based on the result of the machine learning to output a command value C.

The state data acquisition section 22 may be configured as, for example, one of the functions of a CPU that controls the input/output of a computer. Alternatively, the state data acquisition section 22 may be configured as, for example, software for functioning the CPU that controls the input/output of the computer. The state data acquisition section 22 acquires the current position of the machine 80 detected by the current position detection section 82, current time detected by the current time detection section 84, information relating to the circuit configuration of the FPGA device 100 acquired by the circuit configuration acquisition section 86, and the error occurrence state of the FPGA device 100 detected by the error detection section 87 as state data S0 and gives the acquired state data S0 to the machine learning device 30. The state data acquisition section 22 may acquire, besides the above data, data on the operating state of the FPGA device 100 detected by the operating state detection section 88 as the state data S0 and give the acquired state data S0 to the machine learning device 30.

The machine learning device 30 includes software (such as a learning algorithm) and hardware (such as the CPU of a computer) for spontaneously learning the optimum value of the circuit configuration of the circuits arranged in the FPGA device through so-called machine learning. The machine learning device 30 associates the number of soft-error occurrence times in the FPGA device 100 with at least one of the current position and the current time of the FPGA device 100 based on the state data S0 acquired from the state data acquisition section 22 to perform the machine learning of the optimum value of the circuit configuration (the positions of the respective circuits and the variations of the circuits) with respect to the current state of the FPGA device 100. In addition, the machine learning device 30 determines the optimum value of the circuit configuration (the positions of the respective circuits and the variations of the circuits) with respect to the current state of the FPGA device 100 based on the state data S0 acquired from the state data acquisition section 22 using past machine learning results, generates a command value C based on the determined positions of the respective circuits and the variations of the circuits, and outputs the generated command value C to the configuration device 110. The optimum value of the circuit configuration learned by the machine learning device 30 corresponds to a model structure expressing the correlation between the information relating to the error occurrence state and one of the current position and the current time of the FPGA device 100, and the circuit configuration of the FPGA device.

Figure 3:
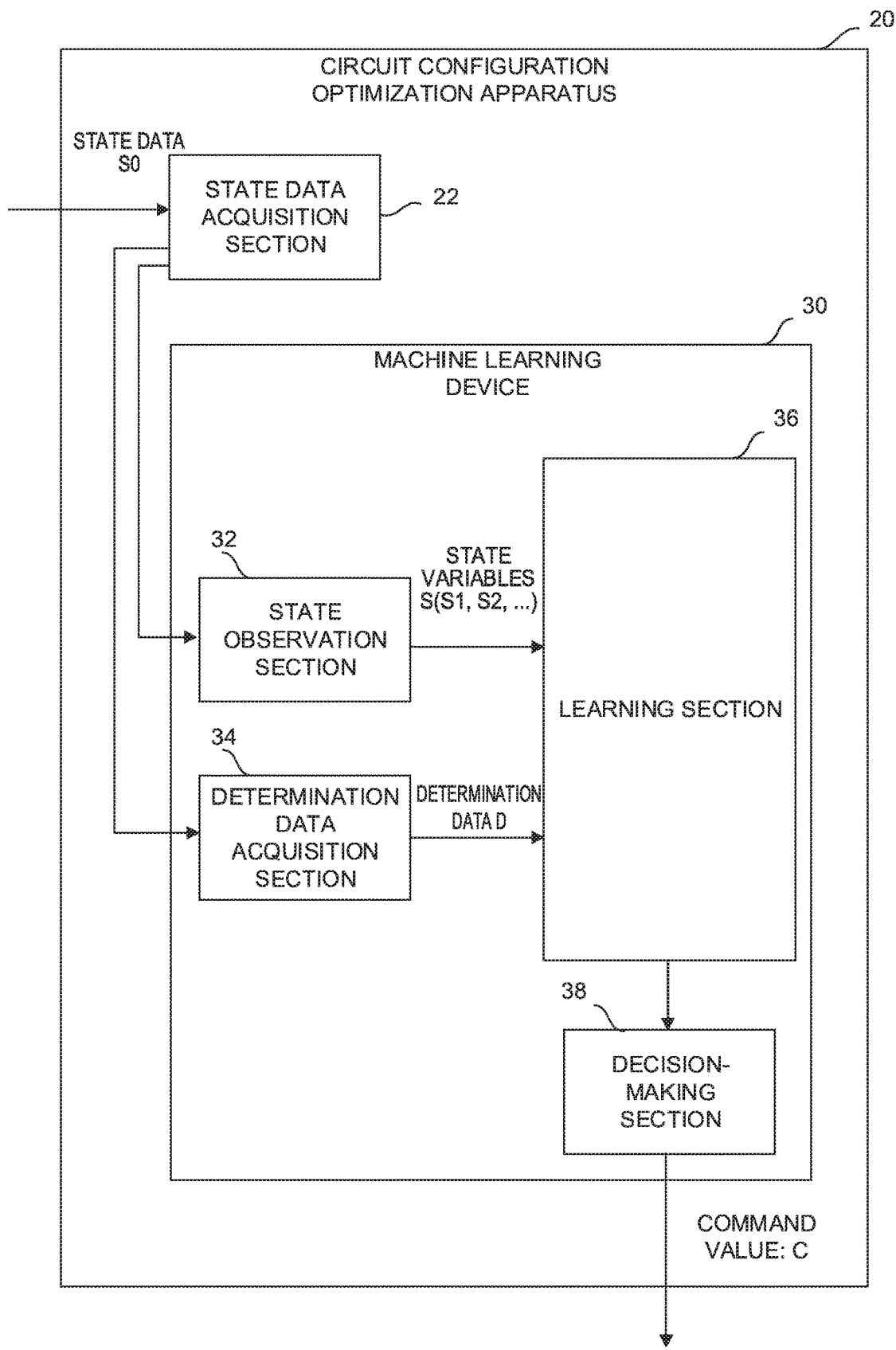
FIG. 3 is a schematic function block diagram of a machine learning device according to the second embodiment.

FIG. 3 is a schematic function block diagram of the machine learning device 30 shown in FIG. 2. As shown in the function block of FIG. 3, the machine learning device 30 of the circuit configuration optimization apparatus 20 includes a state observation section 32, a determination data acquisition section 34, a learning section 36, and a decision-making section 38. The state observation section 32 observes, as state variables S expressing the current state of an environment, circuit configuration data S1 indicating the circuit configuration of the FPGA device set with respect to the error occurrence state of the FPGA device, FPGA error occurrence state data S2 indicating the error occurrence state of the FPGA device, and current position/time data S3 including at least one of the current position and the current time of the FPGA device. The determination data acquisition section 34 acquires determination data D indicating a propriety determination result of the operating state of the FPGA device under the set circuit configuration of the FPGA device. Using the state variables S and the determination data D, the learning section 36 learns the circuit configuration data S1 and both the FPGA error occurrence state data S2 and the current position/time data S3 in association with each other. The decision-making section 38 determines the optimum value of the circuit configuration of the FPGA device based on the circuit configuration data S1, the FPGA error occurrence state data S2, and the current position/time data S3 using a learning result of the learning section 36, and outputs a command value C based on the determined optimum value of the circuit configuration of the FPGA device.

The state observation section 32 may be configured as, for example, one of the functions of the CPU of a computer. Alternatively, the state observation section 32 may be configured as, for example, software for functioning the CPU of the computer. Among the state variables S observed by the state observation section 32, the circuit configuration data S1 may include, for example, report data on the circuit configuration of the FPGA device reported by a skilled circuit designer and given to the circuit configuration optimization apparatus 20 at the initial stage of learning, data on the circuit configuration of the FPGA device actually operated, or the like. In addition, after the learning is advanced to a certain extent, the circuit configuration (acquired by the state data acquisition section 22) of the FPGA device 100 reconfigured by the configuration device 110 may be used.

Figure 4:
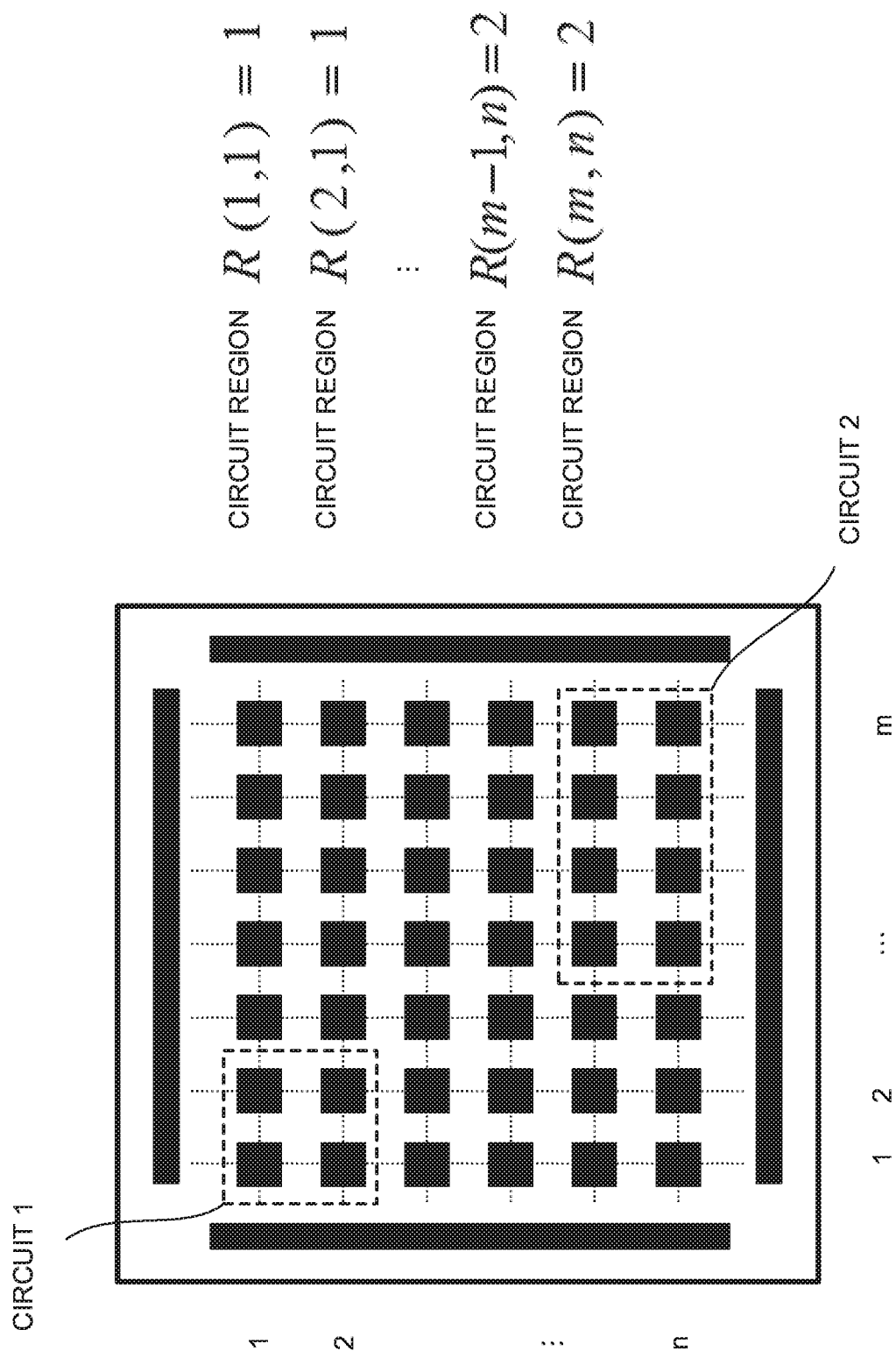
FIG. 4 is a diagram illustrating by an example circuit configuration data S1.

As the circuit configuration data S1, a value acquired by the circuit configuration acquisition section 86 may be used. An example of the circuit configuration data S1 may include logic circuits arranged at the respective positions of the FPGA device and the types of the respective logic circuits. In this case, the logic circuits arranged at the respective positions of the FPGA device may be expressed as follows. As shown in, for example, FIG. 4, partial regions obtained by dividing a region on the FPGA device in an m×n matrix pattern are expressed as arrays, and the arrangement of the logic circuits as the elements of the respective arrays may be expressed by the identifiers of the logic circuits. In addition, as the types of the logic circuits, the variations of the configuration methods of the logic circuits such as standard logic circuits, logic circuits with their area reduced (logic circuits in which an area is reduced instead of lowering the entire function to reduce a soft error ratio), multiplexing logic circuits (logic circuits in which a soft error ratio is reduced by multiplexing; the areas of the logic circuits increase), and logic circuits with an error correcting circuit (logic circuits in which a soft error ratio is reduced with the addition of an error correcting circuit such as an ECC; an operating speed reduces and a heating value and product power increase) may be expressed by identifiers.

In addition, as the FPGA error occurrence state data S2 among the state variables S, values detected by the error detection section 87 may be, for example, used. An example of the FPGA error occurrence state data S2 may include soft error occurrence frequencies at the respective positions of the FPGA device. In this case, for example, soft error occurrence history may be stored in the memory (not shown) of the circuit configuration optimization apparatus 10 for each of partial regions obtained by dividing a region on the FPGA device in an m×n matrix pattern, and the occurrence frequency of a soft error may be calculated for each of the partial regions of the FPGA device calculated based on the history information and used. In the FPGA error occurrence state data S2, error occurrence frequencies at partial regions may be updated so long as the error detection means is allowed to specify the positions (partial regions) of the FPGA device at which a soft error has occurred. On the other hand, the error occurrence frequencies of all the partial regions in which a logic circuit having caused the occurrence of a soft error is arranged may be updated so long as the error detection means is allowed to specify any of the logic circuits of the FPGA device that has caused the occurrence of the soft error. History information for calculating the occurrence frequency of a soft error is saved (as history information on the soft error in the previous cycle) in a saving region on the memory every time the logic circuits of the FPGA device are reconfigured to record new history information.

Moreover, as the current position/time data S3 among the state variables S, values acquired from the current position detection section 82 and the current time detection section 84 may be used.

The determination data acquisition section 34 may be configured as, for example, one of the functions of the CPU of a computer. Alternatively, the determination data acquisition section 34 may be configured as, for example, software for functioning the CPU of the computer. As the determination data D acquired by the determination data acquisition section 34, error occurrence frequencies calculated based on the above history information newly recorded for each of the partial regions of the FPGA device after the circuits of the FPGA device are reconfigured (that is, the history information stored after the reconfiguration of the FPGA device) may be, for example, used. In addition, if necessary, it is possible to use, for example, heating values of the FPGA device actually measured by a thermal sensor or the like provided in an apparatus in which the FPGA device is installed; power consumption amounts of the FPGA device actually measured by a power consumption meter or the like; and operating time of the FPGA device actually measured by a timer or the like. The determination data D is an index expressing a result obtained when the FPGA device is operated under the state variables S.

As described above, while the machine learning device 30 of the circuit configuration optimization apparatus 20 advances machine learning, the acquisition of the FPGA error occurrence state data S2 and the current position/time data S3, the reconfiguration of the logic circuits of the FPGA device, and the acquisition of the determination data D by a sensor or the like are repeatedly performed in an environment.

The learning section 36 may be configured as, for example, one of the functions of the CPU of a computer. Alternatively, the learning section 36 may be configured as, for example, software for functioning the CPU of the computer. According to any learning algorithm collectively called machine learning, the learning section 36 learns the circuit configuration of the FPGA device. The learning section 36 may repeatedly perform learning based on a data set including the above state variables S and the determination data D with respect to the circuit configuration of the FPGA device. When a learning cycle is repeatedly performed for the reconfiguration of the FPGA device, the occurrence frequencies of a soft error calculated based on the above saved history information on the soft error before being reconfigured in the previous cycle are used as the FPGA error occurrence state data S2 among the state variables S. As the current position/time data S3, at least one of the position and the time of the FPGA device reconfigured in the previous cycle is used. As the occurrence frequency circuit configuration data S1, the circuit configuration of the FPGA device reconfigured in the previous cycle based on a machine learning result obtained in a learning cycle is used. In addition, the determination data D indicates a propriety determination result with respect to the operating state of the FPGA device under the circuit configuration of the FPGA device.

By repeatedly performing such a learning cycle, the learning section 36 may automatically identify a feature suggesting the correlation between the error occurrence state of the FPGA device (FPGA error occurrence state data S2) and at least one of the current position and the current time (current position/time data S3), and the circuit configuration of the FPGA device. Although the correlation between the FPGA error occurrence state data S2 and the current position/time data S3, and the circuit configuration of the FPGA device is substantially unknown at the start of a learning algorithm, the learning section 36 gradually identifies a feature indicating the correlation and interprets the correlation as learning is advanced. When the correlation between the FPGA error occurrence state data S2 and the current position/time data S3, and the circuit configuration of the FPGA device is interpreted to a certain reliable extent, learning results repeatedly output by the learning section 36 may be used to select the action (that is, decision making) of determining the form of the circuit configuration of the FPGA device with respect to a current state (that is, the error occurrence state and at least one of the current position and the current time of the FPGA device). That is, as a learning algorithm is advanced, the learning section 36 may gradually approximate the correlation between the error occurrence state and at least one of the current position and the current time of the FPGA device, and the action of determining the form of the circuit configuration of the FPGA device with respect to the current state to an optimum solution.

The decision-making section 38 may be configured as, for example, one of the functions of the CPU of a computer. Alternatively, the decision-making section 38 may be configured as, for example, software for functioning the CPU of the computer. The decision-making section 38 generates and outputs a command value C for reconfiguring the circuits of the FPGA device based on the circuit configuration of the FPGA device with respect to the error occurrence state of the FPGA device learned by the learning section 36. When the decision-making section 38 outputs the command value C for reconfiguring the circuits of the FPGA device to a system that reconfigures the circuit configuration of the FPGA device, the state (circuit configuration data S1) of an environment changes correspondingly.

The state observation section 32 observes, in a next learning cycle, state variables S including circuit configuration data S1 changed after the output of the command value C for reconfiguring the circuits of the FPGA device to an environment by the decision-making section 38. The learning section 36 performs the machine learning using the changed state variables S to learn the circuit configuration of the FPGA device. Based on the learned circuit configuration of the FPGA device, the decision-making section 38 outputs the command value C for reconfiguring the circuits of the FPGA device to the system that reconfigures the circuit configuration of the FPGA device according to state variables S. By repeatedly performing the cycle, the machine learning device 30 advances the learning of the circuit configuration of the FPGA device and gradually improves the reliability of the circuit configuration of the FPGA device determined by the machine learning device 30 itself.

As described above, in the machine learning device 30 of the circuit configuration optimization apparatus 20, the learning section 36 learns the circuit configuration of the FPGA device according to a machine learning algorithm using the state variables S observed by the state observation section 32 and the determination data D acquired by the determination data acquisition section 34. The state variables S are composed of the circuit configuration data S1, the FPGA error occurrence state data S2, and the current position/time data S3 hardly influenced by disturbance. In addition, the determination data D is uniquely calculated by the acquisition of the heating values of the FPGA device actually measured by a thermal sensor or the like provided in an apparatus in which the FPGA device is installed, power consumption amounts of the FPGA device actually measured by a power consumption meter or the like, processing time of the FPGA device actually measured by a timer or the like, the above occurrence frequency of an error for each of the partial regions of the FPGA device, or the like. Accordingly, using learning results of the learning section 36, the machine learning device 30 of the circuit configuration optimization apparatus 20 may automatically and accurately calculate the circuit configuration of the FPGA device according to the error occurrence state of the FPGA device without relying on calculation or estimation.

Where it is possible to automatically calculate the circuit configuration of the FPGA device without relying on calculation or estimation, the appropriate circuit configuration of the FPGA device may be quickly determined only by understanding the error occurrence state (FPGA error occurrence state data S2) and at least one of the current position and the current time (current position/time data S3) of the FPGA device. Accordingly, the circuits of the FPGA device may be efficiently reconfigured.

As a modified example of the machine learning device 30 of the circuit configuration optimization apparatus 20, the state observation section 32 may further observe FPGA operating state data S4 including information relating to an operating state detected by the operating state detection section 88 as the state variables S. In this case, the circuit configuration of the FPGA device may be learned in association with the FPGA operating state data S4, besides the FPGA error occurrence state data S2 and the current position/time data S3.

In the above modified example, the machine learning device 30 may learn the circuit configuration of the FPGA device in consideration of the processing speed, the heating values, the consumption power amounts, or the like of the FPGA device, besides the occurrence frequency of an error for each of the partial regions and at least one of the current position and current time of the FPGA device to reconfigure the circuits of the FPGA device. Thus, when a plurality of circuit configurations of the FPGA device that reduces the occurrence frequency of an error with respect to an error occurrence state, a position, and time is assumed in the state, it becomes possible to preferentially select one of the circuit configurations of the FPGA device that realizes faster processing speed, lower heating values, or lower consumption power amounts.

As another modified example of the machine learning device 30 of the circuit configuration optimization apparatus 20, the learning section 36 may learn the circuit configuration of the FPGA device in each of apparatuses using the state variables S and the determination data D acquired for each of the plurality of apparatuses in which the FPGA device having the same logic circuits is installed. According to the configuration, it is possible to increase an amount of a data set including the state variables S and the determination data D acquired in a certain period of time. Therefore, the learning speed and the reliability of the circuit configuration of the FPGA device may be improved with a set of more various data as inputs.

Figure 5:
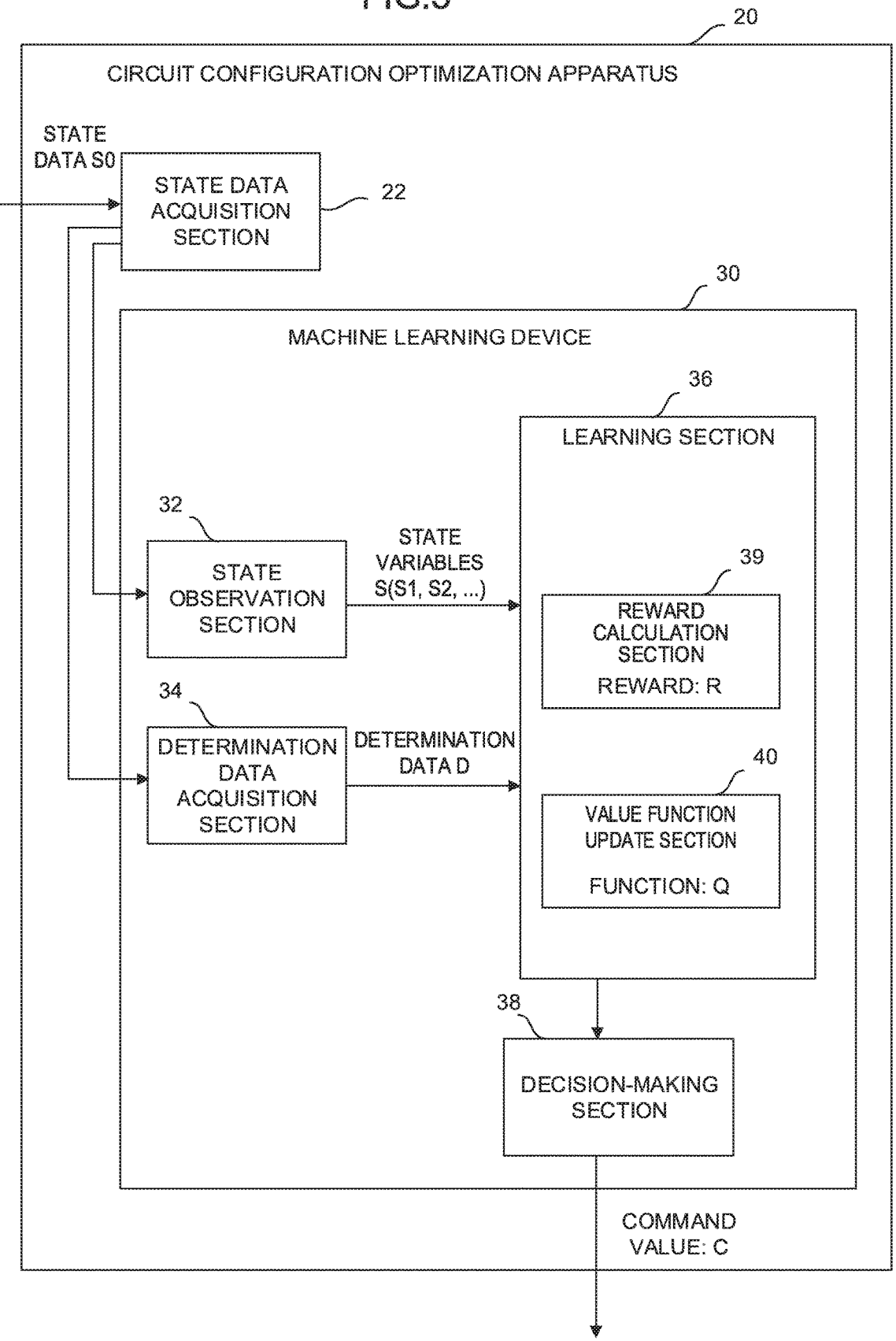
FIG. 5 is a schematic function block diagram showing an embodiment of the circuit configuration optimization apparatus.

In the machine learning device 30 having the above configuration, a learning algorithm performed by the learning section 36 is not particularly limited. For example, a learning algorithm known as machine learning may be employed. FIG. 5 shows, as an embodiment of the circuit configuration optimization apparatus 20 shown in FIG. 3, a configuration including the learning section 36 that performs reinforcement learning as an example of a learning algorithm. The reinforcement learning is a method in which, while the current state (that is, an input) of an environment in which a learning target exists is observed, a prescribed action (that is, an output) is performed in the current state and the cycle of giving any reward to the action is repeatedly performed by trial and error to learn measures (the circuit configuration of the FPGA device in the machine learning device of the present application) to maximize the total of the rewards as an optimum solution.

In the machine learning device 30 of the circuit configuration optimization apparatus 20 shown in FIG. 5, the learning section 36 includes a reward calculation section 39 that calculates a reward R associated with a propriety determination result (corresponding to the determination data D used in the next learning cycle) of the operating state of the FPGA device based on the state variables S, and includes a value function update section 40 that updates, using the reward R, a function Q that expresses a value of the circuit configuration of the FPGA device. The learning section 36 learns the circuit configuration of the FPGA device with respect to the error occurrence state and at least one of the current position and the current time of the FPGA device in such a way that the value function update section 40 repeatedly updates the function Q.

An example of a reinforcement learning algorithm performed by the learning section 36 will be described. The algorithm in this example is known as Q-learning and expresses a method in which a state s of an action subject and an action a possibly taken by the action subject in the state s are assumed as independent variables and a function Q(s, a) that expresses an action value when the action a is selected in the state s is learned. The selection of the action a by which the value function Q becomes maximum in the state s results in an optimum solution. By starting the Q-learning in a state in which the correlation between the state s and the action a is unknown and repeatedly performing the selection of various actions a by trial and error in any state s, the value function Q is repeatedly updated to be approximated to an optimum solution. Here, when an environment (that is, the state s) changes as the action a is selected in the state s, a reward (that is, weighting of the action a) r is obtained according to the change and the learning is directed to select an action a by which a higher reward r is obtained. Thus, the value function Q may be approximated to an optimum solution in a relatively short period of time.

Generally, the update formula of the value function Q may be expressed like the following formula (1). In formula (1), $s_t$ and $a_t$ express a state and an action at time t, respectively, and the state changes to $s_{t+1}$ with the action $a_t$. $r_{t+1}$ expresses a reward obtained when the state changes from $s_t$ to $s_{t+1}$. The term of maxQ expresses Q in a case in which an action a by which the value function Q becomes maximum at time t+1 (which is assumed at time t) is performed. α and γ express a learning coefficient and a discount rate, respectively, and arbitrarily set to fall within 0<α1 and 0<γ≤1, respectively.

$$Q(s_t, a_t) \leftarrow Q(s_t, a_t) + \alpha(r_{t+1} + \gamma \max_a Q(s_{t+1}, a) - Q(s_t, a_t)) \quad [\text{Math. 1}]$$

When the learning section 36 performs the Q-learning, the state variables S observed by the state observation section 32 and the determination data D acquired by the determination data acquisition section 34 correspond to the state s in the update formula, the action of changing the circuit configuration of the FPGA device with respect to a current state (that is, the error occurrence state of the FPGA device) corresponds to the action a in the update formula, and the reward R calculated by the reward calculation section 39 corresponds to the reward r in the update formula. Accordingly, the value function update section 40 repeatedly updates the function Q that expresses values of the circuit configuration of the FPGA device with respect to a current state by the Q-learning using the reward R.

The reward R calculated by the reward calculation section 39 may be positive, for example, if the operating state of the FPGA device is determined to be "appropriate" (for example, a case in which soft error occurrence frequencies of the respective partial regions of the FPGA device fall within an allowable range, a case in which heating values of the FPGA device fall within an allowable range, a case in which power consumption amounts of the FPGA device fall within an allowable range or a case in which operating speed of the FPGA device falls within an allowable range) when the FPGA device is operated based on the circuit configuration of the FPGA device after the circuit configuration of the FPGA device is determined. On the other hand, the reward R calculated by the reward calculation section 39 may be negative, for example, if the operating state of the FPGA device is determined to be "inappropriate" (for example, a case in which soft error occurrence frequencies of the respective partial regions of the FPGA device go beyond an allowable range, a case in which heating values of the FPGA device go beyond an allowable range, power consumption amounts of the FPGA device go beyond an allowable range or a case in which operating speed of the FPGA device goes beyond an allowable range) when the FPGA device is operated based on the circuit configuration of the FPGA device after the circuit configuration of the FPGA device is determined. The absolute values of the positive and negative rewards R may be the same or different from each other. In addition, as determination conditions, a plurality of values included in the determination data D may be combined together to perform a determination. Moreover, in calculating rewards for soft error occurrence frequencies of the respective partial regions of the FPGA device, the reward calculation section 39 may determine proprieties using maximum values of the soft error occurrence frequencies of the respective partial regions or statistical values such as average values of the soft error occurrence frequencies of high-order prescribed partial regions.

In addition, a propriety determination result of the operating state of the FPGA device may include not only "appropriate" and "inappropriate" results but also a plurality of levels of results. As an example, when a maximum value of the allowable range of the heating value of the FPGA device is assumed as $T_{max}$, the reward R=5 is given if a heating amount T of the FPGA device falls within $0 \leq T < T_{max}/5$, the reward R=2 is given if the heating amount T of the FPGA device falls within $T_{max}/5 \leq T < T_{max}/2$, and the reward R=1 is given if the heating amount of the FPGA device falls within $T_{max}/2 \leq T \leq T_{max}$. In addition, $T_{max}$ may be set to be relatively larger at the initial stage of the learning and set to decrease as the learning is advanced.

Note that there is a case that an error is returned from the configuration device 110 even if the reconfiguration of the FPGA device is attempted based on a determined circuit configuration when the circuit configuration of the FPGA device is determined based on a result of the learning section 36 (the occurrence of the error in this case results from a condition in which an area configuring logic circuits is insufficient, a condition in which the installation of wiring is not allowed, or the like). In such an exceptional state, the circuit configuration of the FPGA device for the same state is determined again, but the learning is advanced beforehand with a reward R calculated by the reward calculation section 39 assumed as a large negative reward R. Thus, the circuit configuration will not be selected in the same state in the next and subsequent cycles.

The value function update section 40 may have an action value table in which the state variables S, the determination data D, and the rewards R are organized in association with action values (for example, numeric values) expressed by the function Q. In this case, the action of updating the function Q with the value function update section 40 is equivalent to the action of updating the action value table with the value function update section 40. At the start of the Q-learning, the correlation between the current state of an environment and the circuit configuration of the FPGA device is unknown. Therefore, in the action value table, various kinds of the state variables S, the determination data D, and the rewards R are prepared in association with values (function Q) of randomly-set action values. Note that the reward calculation section 39 may immediately calculate the rewards R corresponding to the determination data D when the determination data D is known, and values of the calculated rewards R are written in the action value table.

When the Q-learning is advanced using the reward R corresponding to a propriety determination result of the operating state of the FPGA device, the learning is directed to select the action of obtaining a higher reward R. Then, values (function Q) of action values for an action performed in a current state are rewritten to update the action value table according to the state of an environment (that is, the state variables S and the determination data D) that changes as the selected action is performed in the current state. By repeatedly performing the update, values (the function Q) of action values displayed in the action value table are rewritten to be larger as an action is more appropriate. Thus, the correlation between a current state (the error occurrence state and at least one of the current position and the current time of the FPGA device) in an unknown environment, and a corresponding action (determining the circuit configuration of the FPGA device) becomes gradually obvious. That is, by the update of the action value table, the relationship between the error occurrence state of the FPGA device and the circuit configuration of the FPGA device is gradually approximated to an optimum solution.

Figure 6:
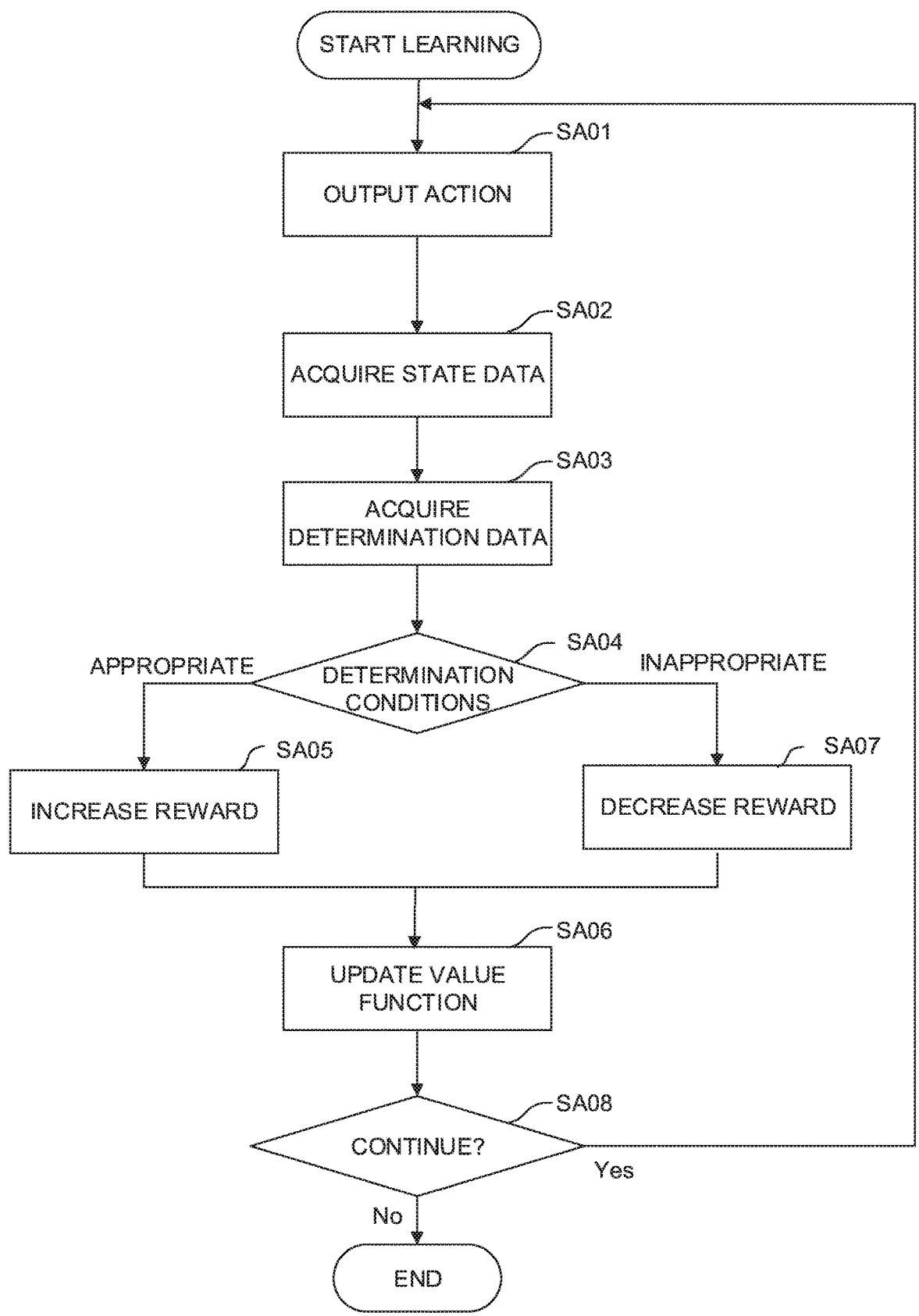
FIG. 6 is a schematic flowchart showing an embodiment of a machine learning method.

The flow of the above Q-learning (that is, an embodiment of a machine learning method) performed by the learning section 36 will be further described with reference to FIG. 6. First, in step SA01, the value function update section 40 randomly selects, by referring to an action value table at that time, the circuit configuration of the FPGA device as an action performed in a current state indicated by the state variables S observed by the state observation section 32. Next, the value function update section 40 imports the state variable S in the current state observed by the state observation section 32 in step SA02, and imports the determination data D in the current state acquired by the determination data acquisition section 34 in step SA03. Then, in step SA04, the value function update section 40 determines if the circuit configuration of the FPGA device is appropriate based on the determination data D. If the circuit configuration is appropriate, the value function update section 40 applies a positive reward R calculated by the reward calculation section 39 to the update formula of the function Q in step SA05. Next, in step SA06, the value function update section 40 updates the action value table using the state variable S and the determination data D in the current state, the reward R, and a value (updated function Q) of an action value. If it is determined in step SA04 that the circuit configuration of the FPGA device is inappropriate, the value function update section 40 applies a negative reward R calculated by the reward calculation section 39 to the update formula of the function Q in step SA07. Then, in step SA06, the value function update section 40 updates the action value table using the state variable S and the determination data D in the current state, the reward R, and the value (updated function Q) of the action value. The learning section 36 updates the action value table over again by repeatedly performing the processing of steps SA01 to SA07 and advances the learning of the circuit configuration of the FPGA device. Note that the processing of calculating the rewards R and the processing of updating the value function in steps SA04 to SA07 are performed for each of data contained in the determination data D.

Figure 7A:
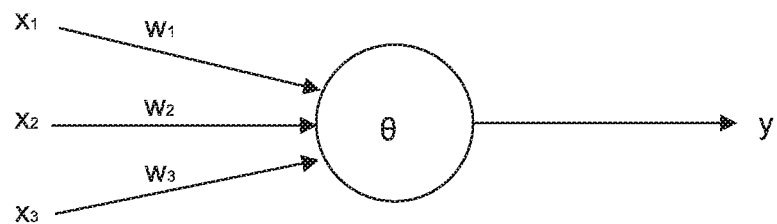
FIG. 7A is a diagram showing a neuron.
Figure 7B:
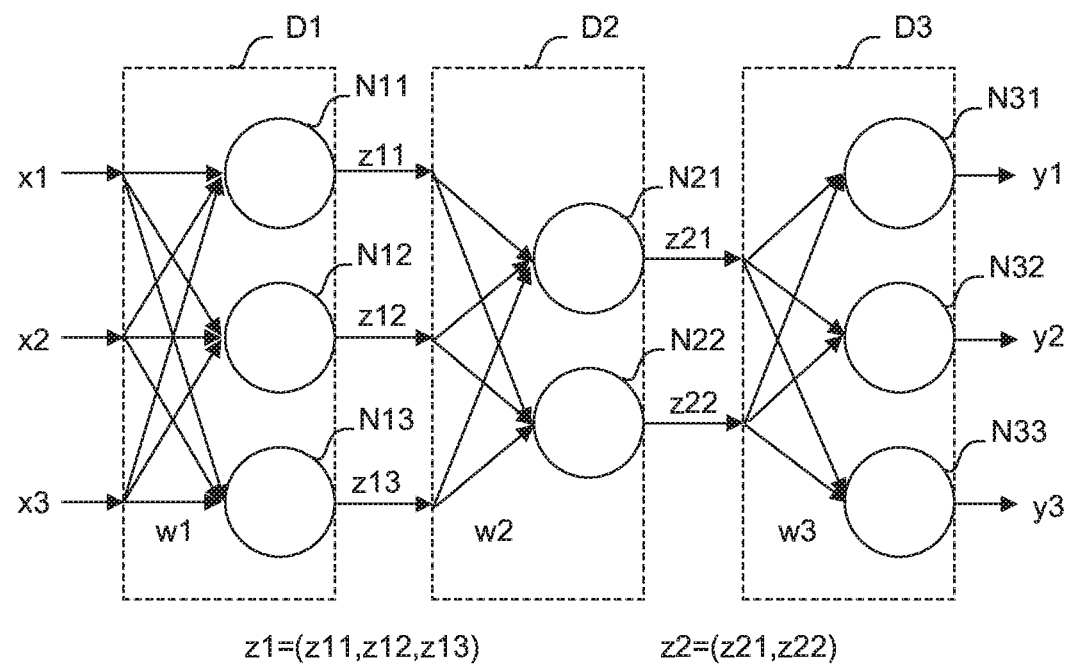
FIG. 7B is a diagram for describing a neural network.

In advancing the above reinforcement learning, a neural network may be, for example, used instead of the Q-learning. FIG. 7A schematically shows a neuron model. FIG. 7B schematically shows the model of a neural network having three layers in which the neurons shown in FIG. 7A are combined together. The neural network may be configured by, for example, a calculation unit, a storage unit, or the like following a neuron model.

The neuron shown in FIG. 7A outputs a result y with respect to a plurality of inputs x (here, inputs $x_1$ to $x_3$ as an example). The inputs $x_1$ to $x_3$ are multiplied by weights w ($w_1$ to $w_3$) corresponding to these inputs, respectively. Thus, the neuron outputs the result y expressed by the following formula (2). Note that in the following formula (2), an input x, a result y, and a weight w are all vectors. In addition, θ expresses a bias, and $f_k$ expresses an activation function.

$$y = f_k(\Sigma_{i=1}^{n} x_i w_i - \theta) \qquad \text{[Math. 2]}$$

In the neural network having the three layers shown in FIG. 7B, a plurality of inputs x (here, inputs x1 to x3 as an example) is input from the left side of the neural network, and results y (here, results y1 to y3 as an example) are output from the right side of the neural network. In the example shown in FIG. 7B, the inputs x1 to x3 are multiplied by corresponding weights (collectively expressed as w1) and input to three neurons N11 to N13, respectively.

In FIG. 7B, the respective outputs of the neurons N11 to N13 are collectively expressed as z1. The outputs z1 may be regarded as feature vectors obtained by extracting feature amounts of the input vectors. In the example shown in FIG. 7B, the respective feature vectors z1 are multiplied by corresponding weights (collectively indicated as w2) and input to two neurons N21 and N22, respectively. The feature vectors z1 express the features between the weights w1 and the weights w2.

In FIG. 7B, the respective outputs of neurons N21 and N22 are collectively expressed as z2. The outputs z2 may be regarded as feature vectors obtained by extracting feature amounts of the feature vectors z1. In the example shown in FIG. 7B, the respective feature vectors z2 are multiplied by corresponding weights (collectively indicated as w3) and input to three neurons N31 to N33, respectively. The feature vectors z2 express the features between the weights w2 and the weight w3. Finally, the neurons N31 to N33 output the results y1 to y3, respectively.

Note that it is possible to employ so-called deep learning in which a neural network forming three or more layers is used.

In the machine learning device 30 of the circuit configuration optimization apparatus 20, the learning section 36 performs the calculation of the state variables S and the determination data D as inputs x in a multilayer structure according to the above neural network to be capable of outputting the circuit configuration (result y) of the FPGA device. Note that the action mode of the neural network includes a learning mode and a value prediction mode. For example, it is possible to learn a weight w using a learning data set in the learning mode and determine an action value using the learned weight w in the value prediction mode. Note that detection, classification, deduction, or the like may be performed in the value prediction mode.

The configuration of the above circuit configuration optimization apparatus 20 may be described as a machine learning method (or software) performed by the CPU of a computer. The machine learning method is a method for learning the circuit configuration of a FPGA device. The CPU of a computer performs: a step of observing circuit configuration data S1 indicating the circuit configuration of the FPGA device, FPGA error occurrence state data S2 indicating the error occurrence state of the FPGA device, and current position/time data S3 indicating at least one of a current position and current time as state variables S expressing the current state of an environment in which the FPGA device is operated; a step of acquiring determination data D indicating a propriety determination result of the operating state of the FPGA device; and a step of learning the circuit configuration of the FPGA device and the FPGA error occurrence state data S2, and the current position/time data S3 in association with each other using the state variables S and the determination data D.

Figure 8:
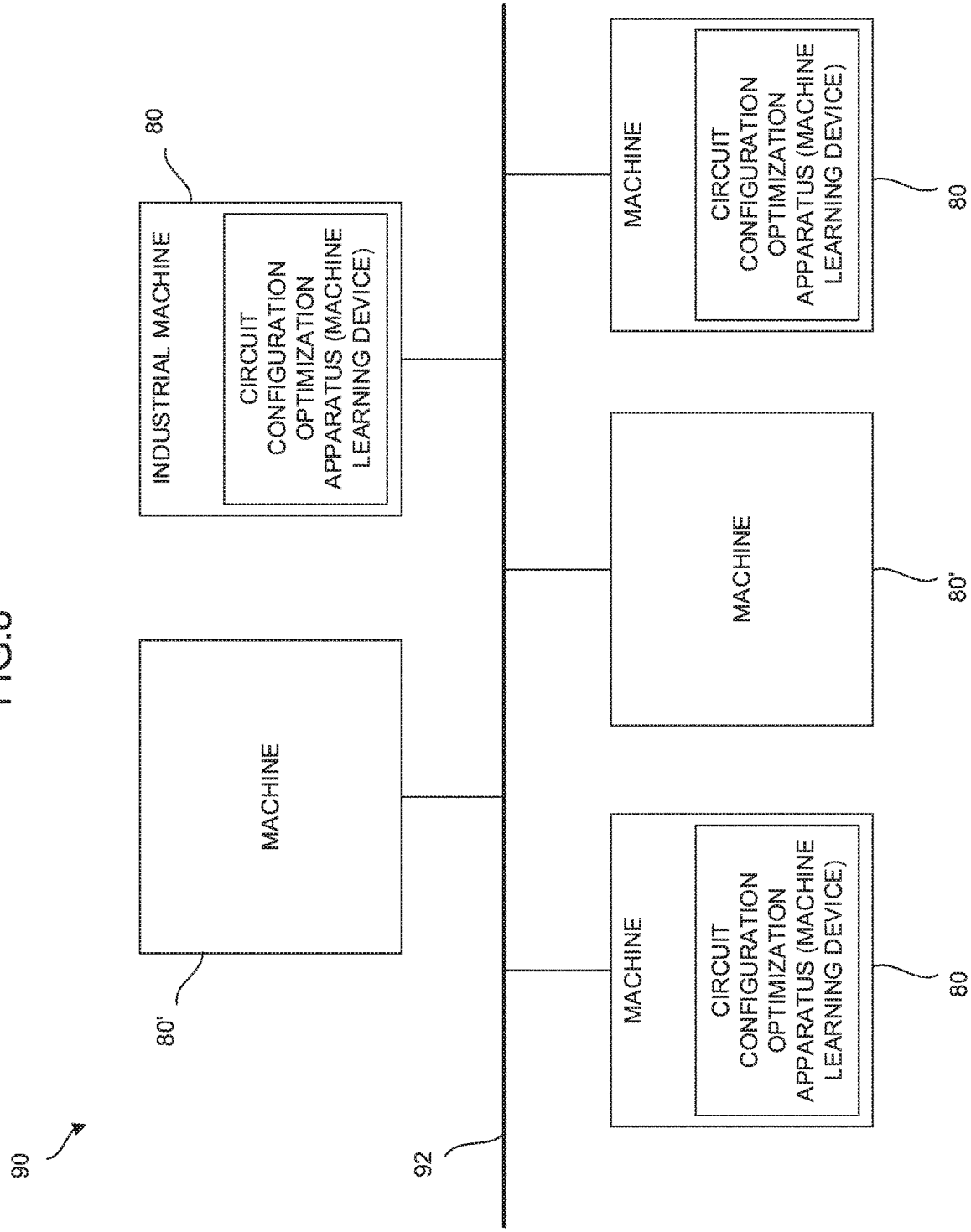
FIG. 8 is a schematic function block diagram showing an embodiment of a system in which circuit configuration optimization apparatuses are incorporated.

FIG. 8 shows a system 90 including machines 80 according to an embodiment. The system 90 includes a plurality of machines 80 and 80' having at least the same machine configuration and a wired/wireless network 92 that connects the machines 80 and 80' to each other. At least one of the plurality of industrial machines 80 and 80' is configured as a machine 80 including the above circuit configuration optimization apparatus 20. In addition, the system 90 may have machines 80' that do not include the circuit configuration optimization apparatus 20. The machines 80 and 80' have a FPGA device in which logic circuits for the same purpose are configured, and have a configuration for reconfiguring the circuits of the FPGA device.

In the system 90 having the above configuration, the machines 80 including the circuit configuration optimization apparatus 20 among the plurality of industrial machines 80 and 80' may automatically and accurately calculate the circuit configuration of the FPGA device according to the error occurrence state of the FPGA device without relying on calculation or estimation using learning results of the learning section 36. In addition, the circuit configuration optimization apparatus 20 of at least one of the machines 80 may learn the circuit configuration of the FPGA device common to all the machines 80 and 80' based on state variables S and determination data D obtained for each of the other plurality of industrial machines 80 and 80' so that the learning results are shared between all the machines 80 and 80'. Accordingly, the system 90 makes it possible to improve the speed and the reliability of learning the circuit configuration of the FPGA device with a broader range of data sets (including state variables S and determination data D) as inputs.

Figure 9:
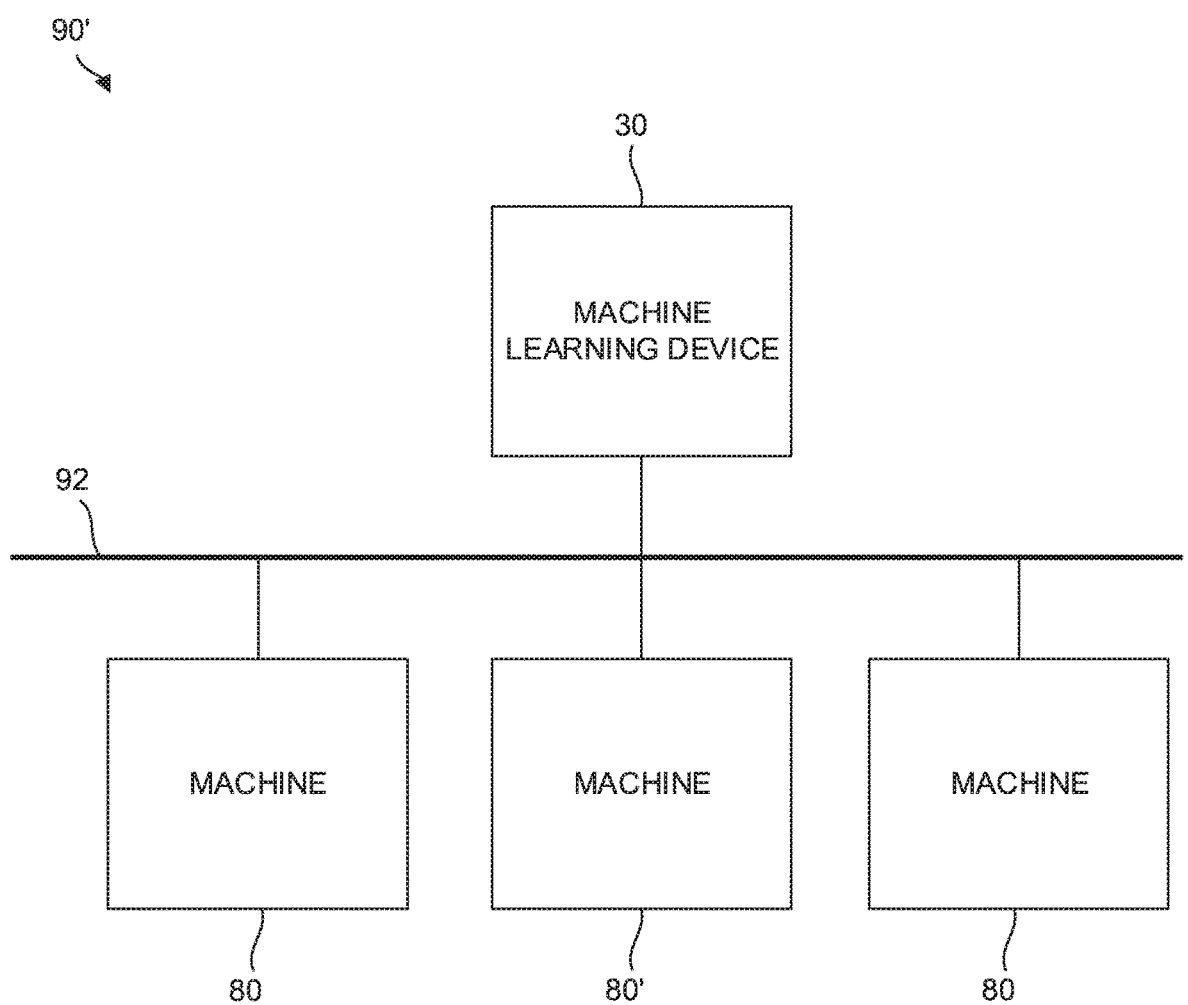
FIG. 9 is a schematic function block diagram showing another embodiment of a system in which a circuit configuration optimization device is incorporated.
Figure 10:
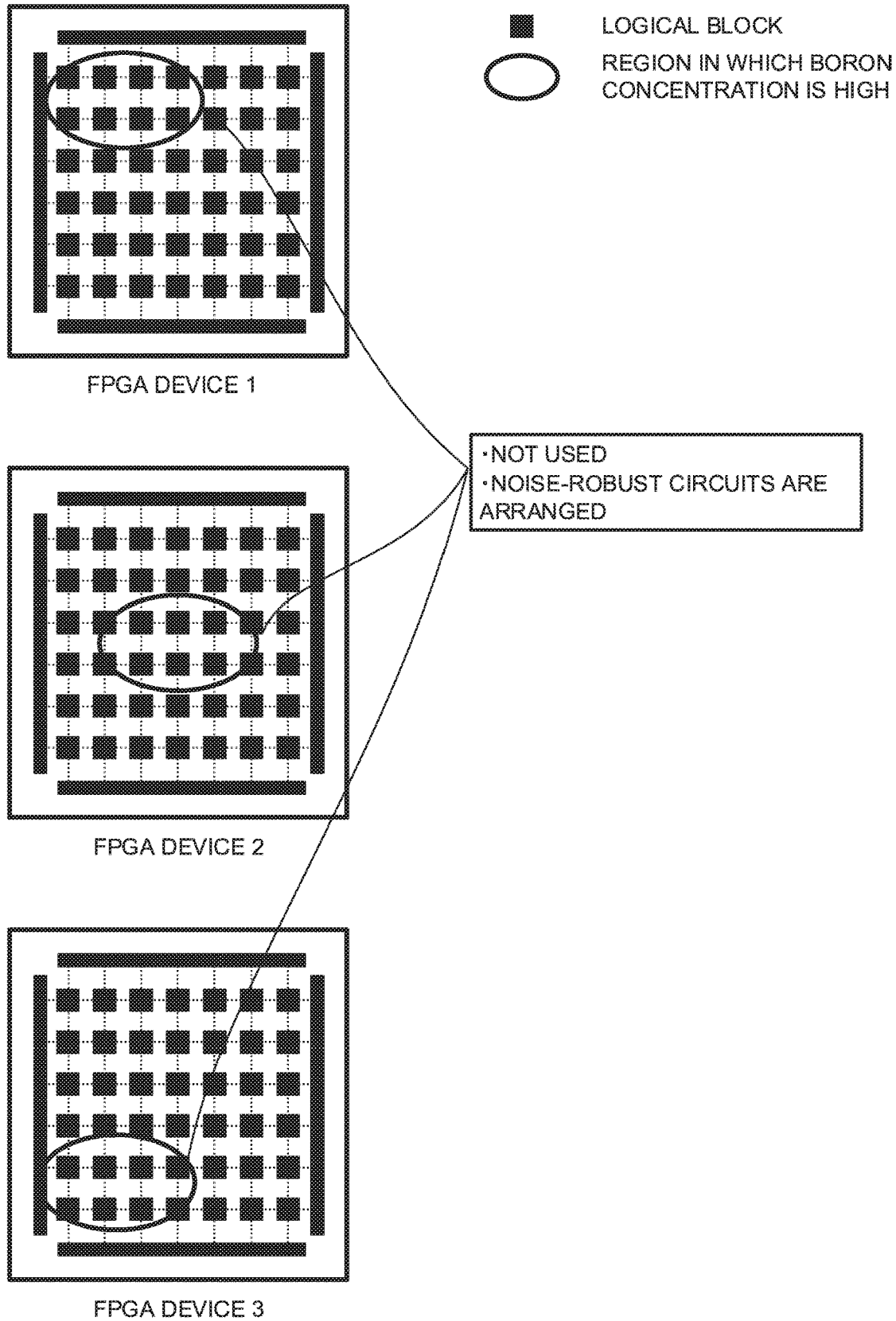
FIG. 10 is a schematic structural diagram of FPGA devices.

FIG. 9 shows a system 90' including machines 80' according to another embodiment. The system 90' includes the machine learning device 30, the plurality of machines 80' having the same machine configuration, and a wired/wireless network 92 that connects the industrial machines 80' and the machine learning device 30 to each other.

In the system 90' having the above configuration, the machine learning device 30 may learn the circuit configuration of the FPGA device according to the error occurrence state and at least one of the current position and the time of the FPGA device common to all the machines 80' based on state variables S and determination data D obtained for each of the plurality of machines 80', and automatically and accurately calculate the circuit configuration of the FPGA device according to the error occurrence state of the FPGA device without relying on calculation or estimation using the learning results.

In the system 90', the machine learning device 30 may have a configuration existing in a cloud server or the like provided in the network 92. According to the configuration, a desired number of the machines 80' may be connected to the machine learning device 30 where necessary regardless of the existing locations and the times of the plurality of machines 80'.

Workers engaging in the systems 90 and 90' may perform a determination as to whether the achievement degree of learning the circuit configuration of the FPGA device (that is, the reliability of the circuit configuration of the FPGA device) with the machine learning device 30 has reached a required level at an appropriate timing after the start of learning by the machine learning device 30.

The embodiments of the present invention are described above. However, the present invention is not limited to the examples of the above embodiments and may be carried out in various modes with the addition of appropriate modifications.

For example, a learning algorithm performed by the machine learning device 30, a calculation algorithm performed by the machine learning device 30, and a control algorithm performed by the circuit configuration optimization apparatuses 10 and 20 are not limited to the above algorithms, but various algorithms may be employed.

In addition, the above embodiments describe an example in which the machine learning device 30 performs machine learning online on the circuit configuration optimization apparatus 20. However, the machine learning device 30 may record the state data S and the determination data D as log data during the operation of the FPGA device, collect the recorded log data, and perform machine learning based on the state data S and the determination data D acquired from the collected log data.

The embodiments of the present invention are described above. However, the present invention is not limited to the examples of the above embodiments and may be carried out in other modes with the addition of appropriate modifications.

The invention claimed is:

1. A circuit configuration optimization apparatus that optimizes a circuit configuration and arrangement of a field programmable gate array (FPGA) device included in a machine, the circuit configuration optimization apparatus comprising:
   a state data acquisition section that acquires the current position of the FPGA device and the current time as state data representing whether the machine faces the sun or not; and
   a circuit configuration determination section that determines a circuit configuration of the FPGA device based on the state data acquired by the state data acquisition section, and outputs a command value for reconfiguring the determined circuit configuration on the FPGA device.

2. The circuit configuration optimization apparatus according to claim 1, further comprising:
   a circuit configuration table that stores, in association with at least either the current position or the current time, the circuit configuration of the FPGA device suitable for the current position or the current time, wherein
   the circuit configuration determination section determines, with reference to the circuit configuration table, the circuit configuration of the FPGA device based on the state data acquired by the state data acquisition section.

3. The circuit configuration optimization apparatus according to claim 1, further comprising:
   a machine learning device that functions as the circuit configuration determination section and learns the circuit configuration of the FPGA device, wherein
   the state data acquisition section further acquires, as the state data, information relating to the circuit configuration of the FPGA device and information indicating an error occurrence state of the FPGA device, the machine learning device has:

a state observation section that observes, as state variables expressing a current state of an environment, FPGA device circuit configuration data indicating the circuit configuration of the FPGA device, FPGA error occurrence state data indicating the error occurrence state of the FPGA device, and current position/time data indicating at least either the current position or the current time, from the state data acquisition section;

a determination data acquisition section that acquires determination data indicating a propriety determination result of an operating state of the FPGA device; and a learning section that learns the circuit configuration of the FPGA device in association with the FPGA error occurrence state data and the current position/time data, using the state variables and the determination data.

4. The circuit configuration optimization apparatus according to claim 3, wherein the state data acquisition section further acquires, as the state data, at least any of a heating amount, power consumption, and operating speed of the FPGA device, the state observation section further observes, as the state variables, FPGA device operating state data including at least any of the heating amount, the power consumption, and the operating speed of the FPGA device, from the state data acquisition section, and the learning section learns the circuit configuration of the FPGA device in association with the FPGA error occurrence state data, the current position/time data, and the FPGA device operating state data.

5. The circuit configuration optimization apparatus according to claim 3, wherein the learning section has:

a reward calculation section that calculates a reward associated with the propriety determination result; and a value function update section that updates, using the reward, a function that expresses a value of the circuit configuration of the FPGA device with respect to the error occurrence state and at least either the current position or the current time of the FPGA device.

6. The circuit configuration optimization apparatus according to claim 3, wherein the learning section performs calculation of the state variables and the determination data in a multilayer structure.

7. The circuit configuration optimization apparatus according to claim 3, further comprising:

a decision-making section that outputs a command value based on the circuit configuration of the FPGA device, according to a learning result of the learning section.

8. The circuit configuration optimization apparatus according to claim 3, wherein the learning section learns the circuit configuration of the FPGA device in each of a plurality of machines, using the state variables and the determination data obtained for each of the plurality of machines.

9. The circuit configuration optimization apparatus according to claim 3, wherein the machine learning device exists in a cloud server.

10. A machine learning device that learns a circuit configuration of a FPGA device included in a machine, the machine learning device comprising:

a state observation section that observes, as state variables expressing a current state of an environment, FPGA device circuit configuration data indicating the circuit configuration of the FPGA device, FPGA error occurrence state data indicating an error occurrence state of the FPGA device, and current position/time data indicating at least either the current position or the current time representing whether the machine faces the sun or not;

a determination data acquisition section that acquires determination data indicating a propriety determination result of an operating state of the FPGA device; and a learning section that learns the circuit configuration of the FPGA device in association with the FPGA error occurrence state data and the current position/time data, using the state variables and the determination data.

* * * * *